United States Patent [19]

Chiang et al.

[11] Patent Number: 5,480,811
[45] Date of Patent: Jan. 2, 1996

[54] ISOLATION OF PHOTOGENERATED CARRIERS WITHIN AN ORIGINATING COLLECTING REGION

[76] Inventors: Shang-Yi Chiang, 295 La Casa Via, Walnut Creek, Calif. 94598; John Moll, 4111 Old Trace Rd., Palo Alto, Calif. 94306

[21] Appl. No.: 876,663

[22] Filed: Apr. 30, 1992

Related U.S. Application Data

[63] Continuation of Ser. No. 735,199, Jul. 24, 1991, abandoned, which is a continuation of Ser. No. 538,307, Jun. 14, 1990, abandoned.

[51] Int. Cl.$^6$ ................................................. H01L 21/76
[52] U.S. Cl. ........................... 437/3; 437/5; 437/159; 437/61; 437/987
[58] Field of Search ........................ 437/3, 5, 159, 437/987, 61; 257/446

[56] References Cited

U.S. PATENT DOCUMENTS

| | | |
|---|---|---|
| 2,739,088 | 3/1956 | Pfann . |
| 2,813,048 | 11/1957 | Pfann . |
| 4,078,243 | 3/1978 | DeBar et al. . |
| 4,173,496 | 11/1979 | Chiang et al. . |
| 4,370,179 | 1/1983 | Roger . |
| 4,686,761 | 8/1987 | Hacskaylo ............................ 437/5 |
| 4,879,470 | 11/1989 | Sugawa et al. . |
| 5,189,297 | 2/1993 | Ahlgren ............................... 437/5 |
| 5,252,857 | 10/1993 | Mita et al. ........................... 257/446 |

FOREIGN PATENT DOCUMENTS

| | | |
|---|---|---|
| 62-145867 | 6/1987 | Japan . |
| 62-232959 | 10/1987 | Japan . |
| 63-161665 | 7/1988 | Japan . |
| 1205564 | 8/1989 | Japan . |
| 1205475 | 8/1989 | Japan . |
| 1214174 | 8/1989 | Japan ............................... 257/446 |
| 271567 | 3/1990 | Japan . |

*Primary Examiner*—George Fourson

[57] ABSTRACT

A photosensing array and a method of making the same wherein the array includes a semiconductor substrate having collecting regions and recrystallized regions. Each collecting region is operatively associated with a photosensing element. Adjacent collecting regions are separated by a recrystallized region. The recrystallized regions are formed by thermally migrating doping metal into the semiconductor substrate using thermal zone gradient melting. With respect to the collecting regions, the recrystallized regions have a relative conductivity level or a conductivity type such that the recrystallized regions have the property of impeding photogenerated carrier migration from one collecting region to an adjacent collecting region. Preferably, the doping metal is one having a high absorption coefficient to block passage of photons between adjacent collecting regions.

4 Claims, 3 Drawing Sheets

1

ISOLATION OF PHOTOGENERATED CARRIERS WITHIN AN ORIGINATING COLLECTING REGION

CROSS REFERENCED TO RELATED APPLICATION

This is a continuation of application Ser. No. 07/735,199, filed on Jul. 24, 1991, now abandoned, which is a File Wrapper continuation of application Ser. No. 07/538,307, filed on Jun. 14, 1990, now abandoned.

TECHNICAL FIELD

This invention relates to optical and photogenerated carrier isolation of photosensing elements in an array of elements.

BACKGROUND ART

A semiconductor photosensing array is often used in instruments such as spectrophotometers and gas chromatographs to measure the spectrum of ultraviolet, visible and near infrared light. A large number of closely spaced photosensing elements are positioned to form an array and a beam of incident light is dispersed with respect to wavelength by a diffraction grating or similar dispersing device. As a result of such dispersement by wavelength, light having different wavelength ranges falls on different photosensing elements in the array.

For example, light may be passed through a sample to be analyzed, whereafter the light is directed to a diffraction grating, prism or other wavelength dispersal device so that different wavelengths of light are dispersed in different spatial directions. The desired wavelength range is intercepted by the photosensing array. The accuracy of analysis is primarily dependent upon the wavelength dispersal device and upon the spatial resolution of the photosensing array. Ideally, incident light strikes the photosensing array at normal incidence and any light passing through a particular sensing element is detected only by that sensing element. However, in practice photons may reach the photosensing array at an angle other than 90°. Moreover, the photosensing elements are typically arranged in a uniformly doped substrate. When light enters the uniformly doped collecting region associated with a particular photosensing element, photogenerated carriers are formed. While some of the photogenerated carriers arrive at the photosensing element through which the light passed, a photogenerated carrier is subject to random motion and can diffuse a significant distance to the collecting region of a distant photosensing element. This random diffusion causes a spurious signal to degrade the spatial resolving power of the array and has been termed "optical crosstalk".

Regarding the problem of light entering one collecting region and passing into an adjacent collecting region wherein carriers are photogenerated, the arrays are manufactured to reduce the likelihood of such occurrence. For example, the photosensing elements are spaced apart to provide a control region and the elements are covered by materials which act as a waveguide within which an optical ray arriving at an undesired angle will be reflected and eventually absorbed.

Regarding the problem of optical crosstalk, the problem is greater for penetrating long-wavelength light since photogenerated carriers created deep within the semiconductor substrate have a greater probability of diffusing to distant photosensing elements than do carriers generated close to the surface. Because of the low absorption coefficient of materials typically used in manufacture of the semiconductor substrate, e.g., Si, GaAs and Ge, a photon can penetrate and form a carrier at distances of 100 microns or more beneath the light-receiving surface of the semiconductor substrate.

Attempts have been made to reduce optical crosstalk so as to improve the spatial resolution of a photosensing array. U.S. Pat. No. 4,160,985 to Kamins et al., assigned to the assignee of the present application, teaches formation of a buried layer to produce electronic fields in the semiconductor substrate which accelerate photogenerated carriers either toward or away from the surface of the array depending upon the depth of the carriers.

It is an object of the present invention to provide a photosensing array and method of making of same which provide isolation of collecting regions both with respect to an optical ray and with respect to migration of photogenerated carriers.

SUMMARY OF THE INVENTION

The above object has been met by a photosensing array having a semiconductor substrate with collecting regions and recrystallized regions which operate to separate adjacent collecting regions both spatially and with respect to optical crosstalk. Moreover, in a preferred embodiment, the recrystallized regions act to prevent passage of an optical ray from a first collecting region to a second collecting region.

Each collecting region of the semiconductor substrate is operatively associated with a photosensing element, typically a photodiode. The recrystallized regions between collecting regions are formed by placement of a layer of predetermined thickness of suitable electron acceptor or electron donor material on the first surface of the semiconductor substrate. A thermal gradient zone melting technique is employed to thermally migrate the material into the semiconductor substrate in a pattern that separates the collecting regions. The temperature is maintained so that a high concentration of the doping material is established within the semiconductor substrate. This produces a structure whereby a photogenerated carrier produced in a first collecting region of the semiconductor substrate will not migrate into a second collecting region. The concentration is determined by the solubility of the doping material in the semiconductor substrate at the temperature in which the process takes place. For example, the concentration approaches $10^{19}$ cm$^{-3}$ when aluminum is thermally driven through silicon at a temperature of 1200° K.

Preferably, the photosensing array is a linear array of photodiodes. The recrystallized regions typically extend through the entirety of the semiconductor substrate, but this is not critical since photogenerated carrier isolation and not electrical isolation is the goal. Likewise, the collecting regions and recrystallized regions of the semiconductor substrate need not be of opposite conductivity type, since regions of the same type provide photogenerated-carrier isolation if relative conductivity levels are properly established. In fact, isolation by same type regions having different conductivity levels is preferred.

A preferred embodiment is to select a doping material having a high absorption coefficient in the ranges of ultraviolet, visible and infrared light. The absorption coefficient forms recrystallized regions which impede passage of photons between adjacent collecting regions, thereby optically isolating the collecting regions. Antimony is a suitable doping material.

An advantage of the present invention is that the spatial resolution of a photodiode array is significantly improved by prevention of migrating photogenerated carriers. Moreover, the present invention extends the detectable wavelength range of the photodiode array. As noted above, optical crosstalk becomes more severe as the wavelength of light is increased. For light having a wavelength longer than 600 nm, photons penetrate to produce carriers at a distance of a few microns or more beneath the light-receiving surface of the semiconductor substrate. The probability that a photogenerated carrier will be collected by a neighboring photodiode rather than by the overlying photodiode increases with increasing depth of generation of the carrier. For this reason, spectrophotometers typically have a wavelength limit of 800 nm for high spectral resolution, e.g., less than 5 nm. The recrystallized regions between the collecting regions of the present invention provide isolation which extends the detectable high spectral resolution wavelength range to approximately 1000 nm for silicon.

Another advantage is that the present array and method permit more closely packed photodiode arrays. The above-cited patent Kamins et al. regarding the prior art method of reducing optical crosstalk describes photodiodes as having a width of 40 microns, a length of 500 microns and a center-to-center spacing of about 60 microns. The present invention allows a spacing between photodiodes of 5 microns.

BEST MODE FOR CARRYING OUT THE INVENTION

Figure 1:
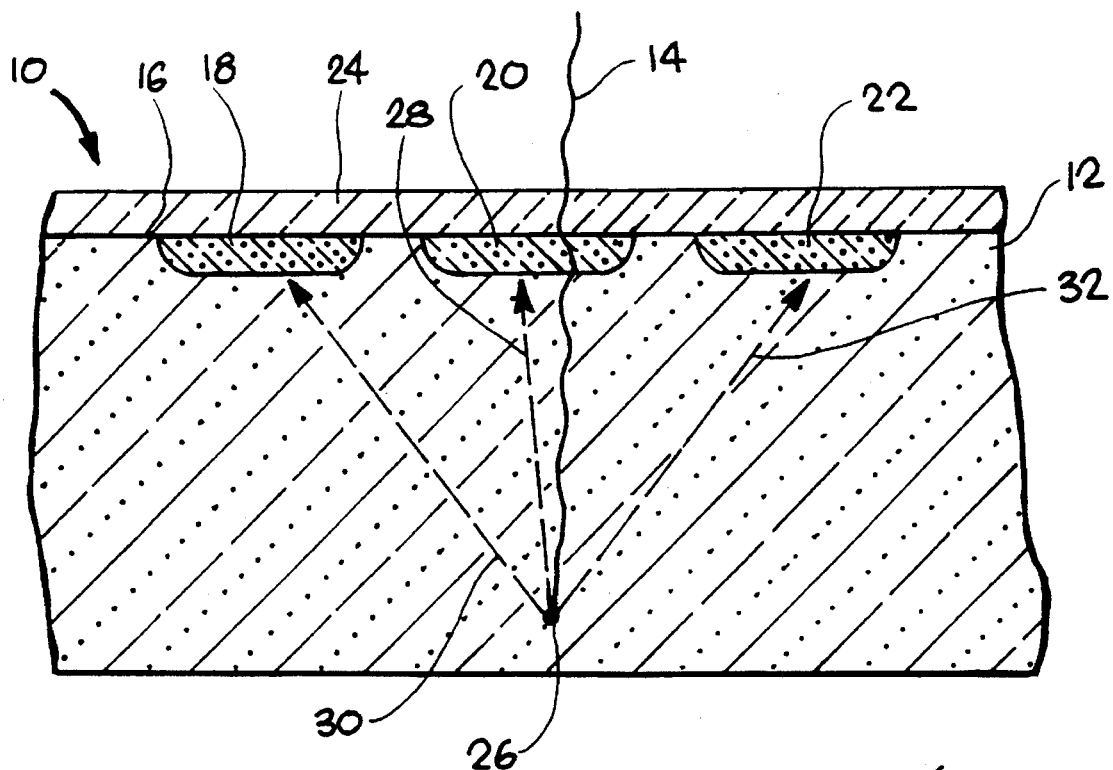
FIG. 1 is a side view of a photodiode array, illustrating the occurrence of optical crosstalk.

With reference to FIG. 1, a semiconductor photosensing array 10 for use in spectrophotometers and the like is shown as including a thick layer 12 of suitable semiconductor material, such as Si, Ge or GaAs, positioned to receive an incident photon 14. The semiconductor substrate 12 is often doped lightly or moderately with an appropriate p type or n type dopant so that the resistivity is approximately 10 ohm-cm. The array 10 has a light-receiving surface 16 that has a plurality of metallic or heavily doped zones which act as photosensing elements 18, 20 and 22. The light-receiving surface 16 of the semiconductor substrate 12 may be covered by a thin layer 24 of insulating or passivating material such as $SiO_2$.

The incident photon 14 passes through the thin insulating layer 24, and possibly through one of the photosensing elements such as 20, into the semiconductor substrate 12. The photon energy photogenerates one or more carriers, such as at 26. Ideally, if the incident photon passes through or very close to a photosensing element 20, a photogenerated carrier 26 will be detected by that photosensing element. However, photogenerated carriers move randomly and a carrier can diffuse a significant distance in the semiconductor substrate 12 to be collected in the space-charge region of an adjacent element, so that detection is at photosensing element 18 or 22. The ideal path for the photogenerated carrier 26 is shown as dashed line 28, while undesirable paths are shown at 30 and 32. A photogenerated carrier migrating to an adjacent photosensing element 18 and 22 gives a spurious signal and degrades the spatial resolving power of the array 10. Control of this optical crosstalk therefore improves the spatial resolution of the array.

Figure 2:
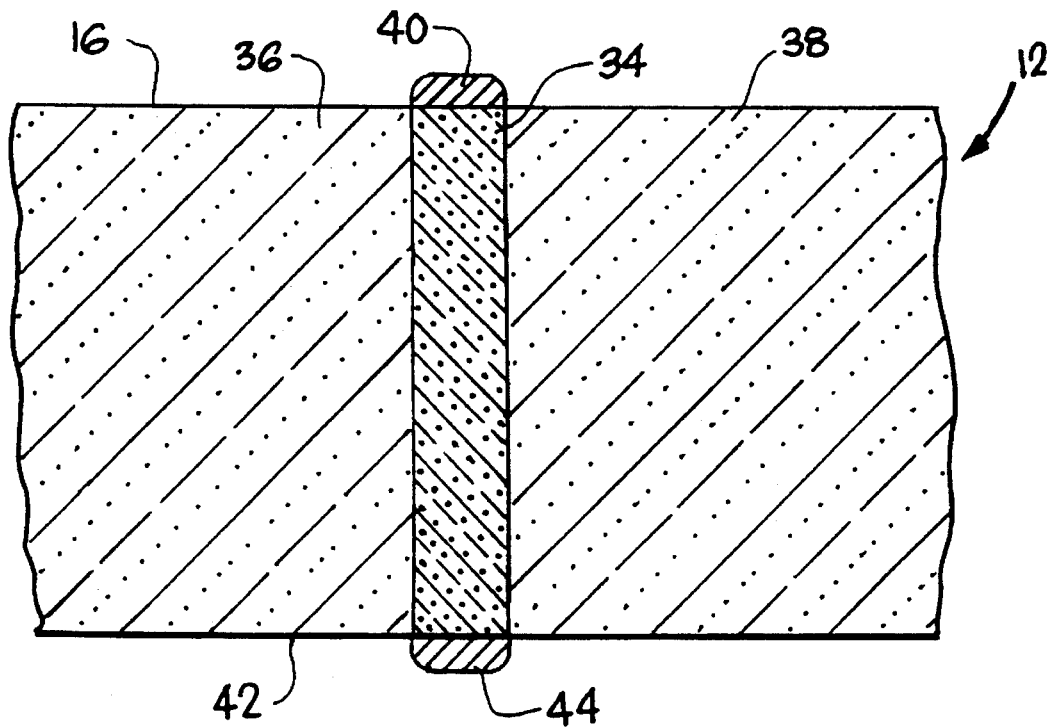
FIG. 2 is a sectional side view showing thermomigration in accord with the present invention.

Referring now to FIG. 2, optical crosstalk can be controlled by provision of a recrystallized region 34 between each photosensing element. The recrystallized region divides the semiconductor substrate 12 into spaced apart collecting regions 36 and 38, with each collecting region being operatively associated with a different photosensing element.

The recrystallized regions 34 of a semiconductor substrate 12 in a photosensing array are produced by the phenomenon of thermomigration. The process of thermomigration is discussed by Pfann in U.S. Pat. Nos. 2,739,088 and 2,813,048, both of which are incorporated by reference herein. Briefly, liquid droplets are embedded in a solid that is subjected to a thermal gradient. In FIG. 2, a droplet 40 of metal is shown as being deposited upon the light-receiving surface 16 of the semiconductor substrate 12, but typically the droplet is etched into the substrate 12 prior to initiation of the thermal gradient. The highest temperature of the imposed thermal gradient is at the surface 42 of the semiconductor substrate 12 opposite to deposition of droplet 40. This causes the temperature on the lower, or front, droplet interface with the substrate to be higher than the temperature at the rear droplet interface. Since the solubility of a solid, such as the silicon substrate 12, in a liquid increases with the temperature, the concentration of dissolved solid atoms is higher in the liquid at the hotter, front interface of the droplet than at the cooler, rear interface. This inequality of concentration produces a concentration gradient of dissolved solid atoms across the liquid droplet. The concentration gradient, in turn, creates a flux of dissolved solid atoms from the front to the rear interface of the liquid droplet. The diffusion flux is fed by the constant dissolving of atoms of the substrate 12 at the hot interface of the droplet. The dissolved solid atoms continue to be deposited at the rear interface, allowing the droplet to move forwardly through the semiconductor substrate 12.

It follows that the temperature gradient must be one at which the lowest temperature is above the melting point of the doping material but below the melting point of the substrate 12. For example, if aluminum is used to form the droplet 40 on a substrate having a thickness of 500 microns, the rear, or light-receiving, surface 16 of the semiconductor substrate 12 must be heated to a temperature above the melting temperature of aluminum, while the front surface 42 may be heated to a temperature which is approximately 2° or 3° C. greater than that of the rear surface. The droplet 40 of aluminum moves through the semiconductor substrate 12 in solution. After the droplet has passed through the semiconductor substrate, the material recrystallizes and a portion of the doping material remains in the recrystallized region 34 at a concentration approximately equal to the solubility limit of the doping material at the relative temperature.

Figure 3:
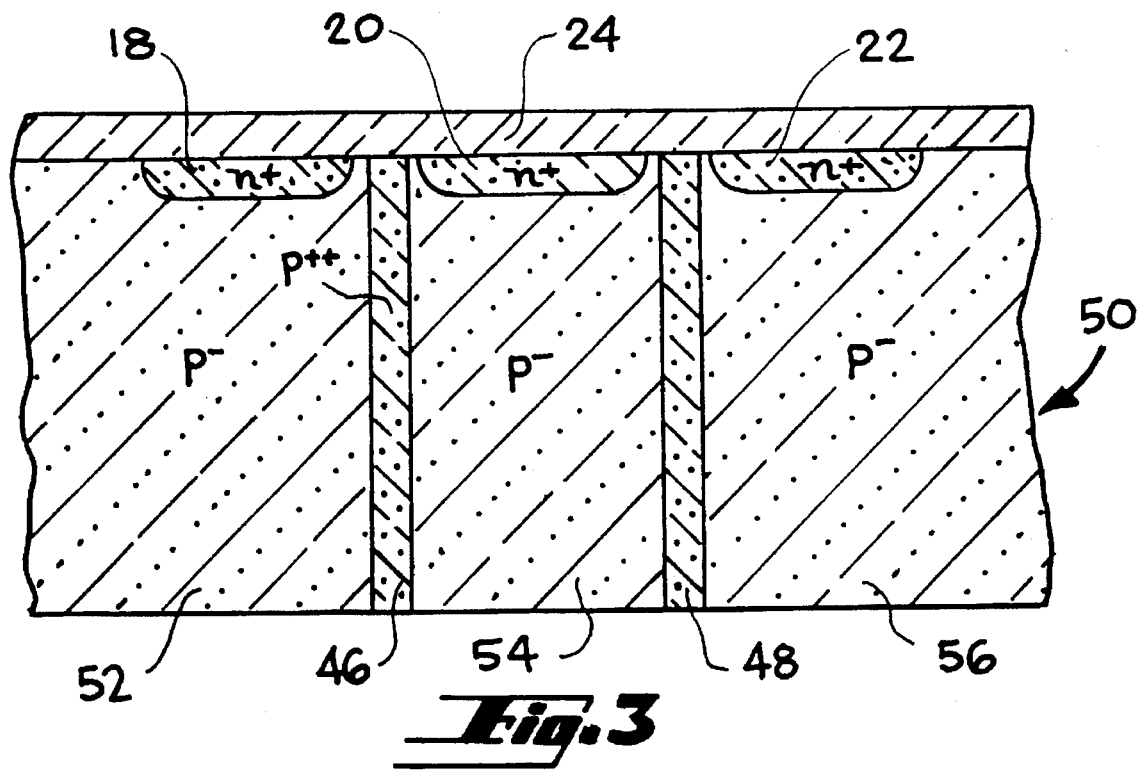
FIG. 3 is a sectional side view of the present invention, illustrating the use of doped semiconductor materials of different electrical conductivity levels and showing thermomigration through the full thickness of the substrate.

When the liquid droplet 40 has passed entirely through the semiconductor substrate, a portion of the doping material exits the substrate at the rear surface 42. The residual material is shown at 44 in FIG. 2. The volume of material is chosen so that the doping material passes through the substrate 12 to the desired length. Typically, the desired length is the entire 500 microns of the substrate, but this is not critical. Photogenerated carrier isolation is possible by thermally migrating doping material a distance of only 50–100 microns, so that while adjacent collecting regions 36 and 38 are not electrically isolated, they are isolated with respect to photogenerated carriers. As shown in FIG. 2, the width of the recrystallized region 34 is substantially less than the length.

Where the doping material is chosen to be aluminum, the recrystallized regions 46 and 48, as shown in FIG. 3, may be a heavily doped $p^{++}$ type region with a very heavy concentration of acceptor ions. The semiconductor substrate 50 may be a lightly doped $p^-$ material. If the p type doping concentration for the semiconductor substrate 50 is $p=10^{15}$ cm$^{-3}$, and the concentration of the recrystallized regions is $p=10^{19}$ cm$^{-3}$, the built-in chemical potential difference between the recrystallized regions and the collecting regions 52, 54 and 56 at room temperature is found to be 0.24 eV. The chemical potential difference acts to form a barrier for photogenerated carriers so as to isolate the collecting regions 52–56. In this manner, a carrier generated in the center collecting region 54 will not migrate to adjacent collecting regions 52 and 56 to be detected by photosensing elements 18 and 22 of those regions.

Figure 5:
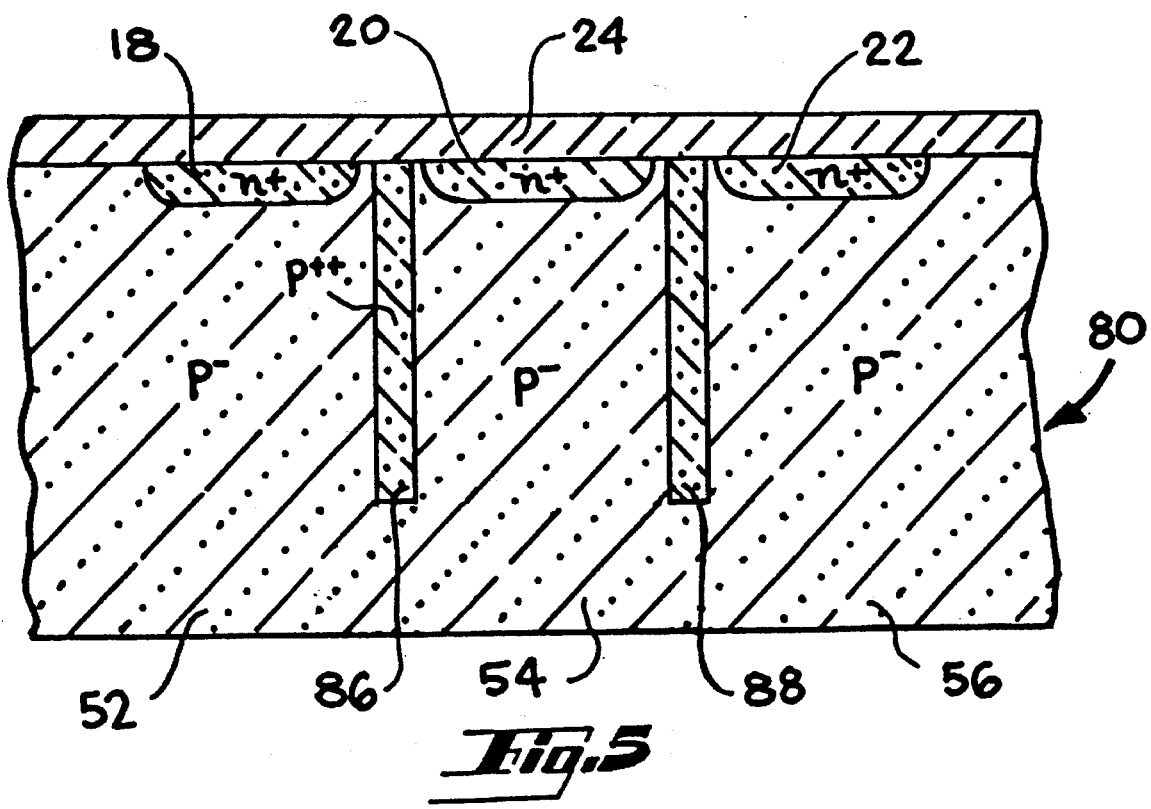
FIG. 5 is a side sectional view of a third embodiment of the present invention, illustrating the use of doped semiconductor materials of different electrical conductivity levels, showing thermomigration through a portion of the thickness of the substrate.

The recrystallized regions 46 and 48 are depicted in FIG. 3 as having been formed to a depth equal to the thickness of the semiconductor substrate 50. As discussed above, it is not critical that these regions extend through the full thickness of the substrate since the goal is to have effective isolation of photogenerated carriers and not electrical isolation. FIG. 5 is a variation of FIG. 3 in which the recrystallized regions 86 and 88 have been thermally migrated through only a portion of the thickness of the semiconductor substrate 80. The remaining elements of the structure shown in FIG. 5 correspond to those shown in FIG. 3 and are therefore represented by the same element numbers.

Figure 4:
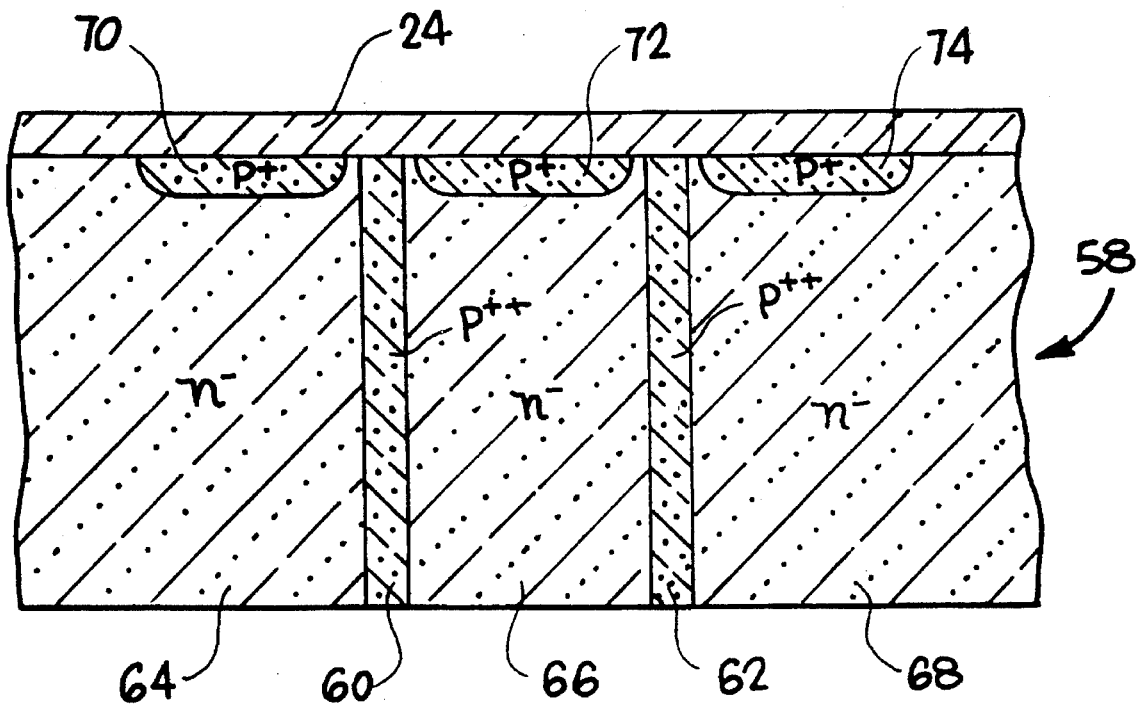
FIG. 4 is a side sectional view of a second embodiment of the present invention, illustrating the use of doped semiconductor materials of different electrical conductivity types.

While the FIG. 3 embodiment of collecting regions 52–56 having the same conductivity type as the recrystallized regions 46 and 48 is the preferred embodiment, regions of opposite types may also provide isolation. The semiconductor substrate 58 of FIG. 4 includes three collecting regions 64, 66 and 68 operatively associated with three photosensing elements 70, 72 and 74. In contrast to the preferred embodiment of FIG. 3, the photogenerated carriers created in a collecting region 64-68 will be attracted by a recrystallized region 60-62. In operation, as carriers accumulate in a particular recrystallized region, the energy barrier presented by the recrystallized region is changed. As a consequence, the detection signal of the photosensing array has an instability over time. This instability is undesirable in many applications. One solution, however, is to bias the recrystallized regions by use of an outside source. A zero bias between the recrystallized regions and the collecting regions overcomes the problem of carrier accumulation within the recrystallized regions, so as to eliminate the instability.

Referring again to FIG. 2, preferably the droplet of metal 40 placed on the light-receiving surface 16 of the semiconductor substrate 12 comprises a metal having a high absorption coefficient. Antimony is an example. The high absorption coefficient, at least in the ranges of ultraviolet, visible and infrared light, provides optical isolation of adjacent collecting regions 36 and 38. That is, the recrystallized region 34 acts as a barrier to photons directed at an angle such that energy would enter the semiconductor substrate 12 in a first collecting region 36 and thereafter pass to the adjacent collecting region 38. Similar to optical crosstalk, this passage of energy would cause a spurious signal and reduce the spatial resolution of the photosensing array. The optical isolation provided by the recrystallized region 34 allows the photosensing elements to be moved more closely together, thereby further improving the spatial resolution of the array.

In addition to the embodiments described above, other arrangements of relative conductivity levels or type may be employed to achieve the desired potential difference which acts as a barrier to carrier migration. However, the preferred embodiments, as shown in FIG. 3, have the same conductivity types for the collecting and recrystallized regions but with different conductivity levels.

We claim:

1. A method of making a photosensing array to produce an array for optical imaging comprising, forming an array of spaced apart photosensing elements on a first surface of a semiconductor substrate, said semiconductor substrate having a first type of electrical conductivity and a first level of electrical conductivity, said semiconductor substrate being doped with a conductive impurity to have a uniform conductivity type and a uniform concentration of said conductive impurity, and creating collecting regions within said monolithic semiconductor material and between said photosensing elements comprising the substeps of:

depositing a metal on said first surface between adjacent photosensing elements, and forming downwardly extending thin recrystallization regions into said semiconductor substrate to a distance from said first surface that is less than the thickness of said semiconductor substrate using thermal gradient zone melting, the depth of the recrystallization regions being such that the recrystallization regions substantially impedes the migration of photogenerated carriers from one collecting region to an adjacent collecting region.

2. A method of making an array of photosensing elements, comprising the steps of:

providing a semiconductor layer having a first type of electrical conductivity and a first level of electrical conductivity, said semiconductor layer being doped with conductive impurity to have a uniform conductivity type and a uniform concentration of said conductive impurity, forming on a first surface of said semiconductor layer an array of photosensing elements, depositing upon said first surface and between said individual photosensing elements droplets of a metal, forming recrystallized regions between said photosensing elements by thermally migrating said droplets downwardly into said semiconductor layer, wherein the depth of said recrystallization regions is less than the thickness of said semiconductor layer, forming collecting regions thereby, and restricting photogenerated carriers created by electromagnetic energy having a wavelength of up to 1000 nm to the collecting region within which said photogenerated carriers are created by selecting the thickness of said semiconductor layer and the depth of said recrystallization regions such that said recrystallized regions substantially prevents said photogenerated carriers from migrating to collecting regions within which said photogenerated carriers are created.

3. A method of making a photosensing array to produce an array for optical imaging comprising, forming an array of spaced apart photosensing elements on a first surface of a semiconductor substrate, the semiconductor substrate having a first type of electrical conductivity and a first level of electrical conductivity, the semiconductor substrate being doped with a conductive impurity to have a uniform conductivity type and a uniform concentration of the conductive impurity, and creating collecting regions within the semiconductor substrate and between the photosensing elements comprising the substeps of:

depositing a metal on the first surface between adjacent photosensing elements, and forming downwardly extending thin recrystallization regions into the semiconductor substrate using thermal gradient zone melting, the recrystallization regions extending through the entire thickness of the semiconductor substrate, the depth of the recrystallization regions being such that the recrystallization regions substantially impedes the migration of photogenerated carriers from one collecting region to an adjacent collecting region.

4. A method of making an array of photosensing elements, comprising the steps of:

providing a semiconductor layer having a first type of electrical conductivity and a first level of electrical conductivity, the semiconductor layer being doped with a conductive impurity to have a uniform conductivity type and a uniform concentration of the conductive impurity, forming on a first surface of the semiconductor layer an array of photosensing elements, depositing upon the first surface and between the individual photosensing elements droplets of a metal, forming recrystallized regions between the photosensing elements by thermally migrating the droplets downwardly into the semiconductor layer, the recrystallization regions extending through the entire thickness of the semiconductor layer, forming collecting regions thereby, and restricting photogenerated carriers created by electromagnetic energy having a wavelength of up to 1000 nm to the collecting region within which the photogenerated carriers are created by selecting the thickness of the semiconductor layer and the depth of the recrystallization regions such that the recrystallized regions substantially prevents the photogenerated carriers from migrating to collecting regions within which the photogenerated carriers are created.

\* \* \* \* \*